US009171497B2

(12) United States Patent
Zeng

(10) Patent No.: US 9,171,497 B2
(45) Date of Patent: Oct. 27, 2015

(54) METHOD FOR INSPECTING PACKAGING EFFECTIVENESS OF OLED PANEL

(71) Applicant: Shenzhen China Star Optoelectronics Technology Co., Ltd., Shenzhen, Guangdong (CN)

(72) Inventor: Weijing Zeng, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 33 days.

(21) Appl. No.: 13/985,920

(22) PCT Filed: Jun. 26, 2013

(86) PCT No.: PCT/CN2013/077942
§ 371 (c)(1),
(2) Date: Aug. 16, 2013

(87) PCT Pub. No.: WO2014/180038
PCT Pub. Date: Nov. 13, 2014

(65) Prior Publication Data
US 2014/0329342 A1 Nov. 6, 2014

(30) Foreign Application Priority Data
May 6, 2013 (CN) .......................... 2013 1 0163325

(51) Int. Cl.
*H01L 21/00* (2006.01)
*G09G 3/32* (2006.01)

(52) U.S. Cl.
CPC .................................... *G09G 3/3208* (2013.01)

(58) Field of Classification Search
CPC ............... G01R 1/0408; H03K 3/0315; H01L 27/13225; H05K 13/04
USPC .................................... 438/18; 257/E21.522
See application file for complete search history.

(56) References Cited

U.S. PATENT DOCUMENTS 4,891,066 A * 1/1990 Shimotori et al. ............ 420/417
5,458,977 A * 10/1995 Hosokawa et al. ........ 428/411.1
(Continued)

FOREIGN PATENT DOCUMENTS

CN 1588012 A 3/2005
CN 1642367 A 7/2005
(Continued)

*Primary Examiner* — Caridad Everhart
(74) *Attorney, Agent, or Firm* — Andrew C. Cheng

(57) ABSTRACT

The present invention provides a method for inspecting packaging effectiveness of an OLED panel, including: (1) in a manufacture process of an OLED component, forming a test block on a substrate, wherein the test block is made of an active metal, and then forming a plurality of test electrodes, wherein each of the test electrodes has an end connected to the test block and an opposite end extending to the outside for connection with a measurement device; (2) packaging an OLED panel so that said opposite ends of the test electrodes extend out of an enclosing frame; (3) electrically connecting the measurement device to the test electrodes to measure an actual conductivity of the test block; and (4) determining packaging effectiveness according to the actual conductivity. The method of the present invention makes use of conductivity differential of a test block made of an active metal in environments having different water/oxygen content to detect, in a more precise manner, the water/oxygen content in a packaged OLED panel so as to correctly determine the effectiveness of packaging.

13 Claims, 7 Drawing Sheets

(56) References Cited

U.S. PATENT DOCUMENTS

| | | | | |
|---|---|---|---|---|
| 2002/0044124 | A1* | 4/2002 | Yamazaki et al. | 345/92 |
| 2005/0186123 | A1 | 8/2005 | Torres, Jr. | |
| 2007/0292957 | A1* | 12/2007 | Chua et al. | 436/5 |
| 2010/0201901 | A1* | 8/2010 | Koike et al. | 349/43 |
| 2010/0279462 | A1* | 11/2010 | Iwasaki | 438/104 |
| 2010/0294024 | A1* | 11/2010 | Kumar et al. | 73/38 |

FOREIGN PATENT DOCUMENTS

| | | | | |
|---|---|---|---|---|
| CN | 1946998 A | | 4/2007 | |
| CN | 101632010 A | | 1/2010 | |
| CN | 202905791 U | | 4/2013 | |
| WO | WO2005006458 | * | 1/2005 | H01L 51/00 |

* cited by examiner

METHOD FOR INSPECTING PACKAGING EFFECTIVENESS OF OLED PANEL

BACKGROUND OF THE INVENTION

1. Field of the Invention

The present invention relates to the field of flat panel display, and in particular to a method for inspecting packaging effectiveness of an OLED panel.

2. The Related Arts

A flat panel display has a variety of advantages, including thin device body, reduced power consumption, and being free of radiation and is widely used. Flat panel displays that are currently available generally include liquid crystal displays (LCDs) and organic light emitting displays (OLEDs).

The OLEDs, which show the characteristics of self-illumination, high brightness, wide view angle, high contrast, flexibility, and low energy consumption, attract wide attention to serve as the next-generation display measure that gradually substitute the conventional liquid crystal display devices for applications in mobile phone screens, computer monitors, and full-color television. The OLED displaying, which is different from the conventional way of displaying with LED, requires no backlight and adopts extremely thin layers of organic coatings and glass substrates. These organic materials become luminous when electricity is conducted therethrough. However, the organic materials can get readily oxidized with water and consequently, an OLED display panel, which is a display device manufactured based on the organic materials, must be subjected to extremely severe standard of packaging. For commercial applications, an OLED component must be capable of providing a lifetime exceeding or equal to 10,000 hours and meeting the packaging requirements of water permeability less than or equal to $10^{-6}$ g/m$^2$/day and oxygen permeability less than or equal to $10^{-5}$ cc/m$^2$/day (1 atm). This infers that packaging is the most important step of the entire process for manufacturing an OLED display panel and is the key factor that affects the product yield rate.

However, only a few methods are currently available to monitor packaging effectiveness achieved in most of the known OLED panel manufacture processes. One of the known processes is one that uses a desiccant to monitor the packaging effectiveness, of which the operation principle is that the desiccant, when absorbing humidity, gets expanded and photographing is applied to identify the surface areas of the desiccant at a preceding and a subsequent time point, whereby the sizes of the surface areas of the desiccant can be used to determine if the desiccant has been expanded and thus if there is any moisture invasion resulting from poor packaging of the OLED panel. The process is simple in principle bur suffers reliability issue. For example, when the desiccant absorbs moisture and gets expanded, the photographing measure only reflects the variation of the surface area thereof, but comparing the images obtained through photographing cannot reflect a minor volume change caused by the desiccant absorbing moisture. Thus, using the measure of desiccant absorbing moisture and getting expanded to inspect the effectiveness of packaging still needs further improvement.

In view of the above shortcomings, as shown in FIG. 1, a method for inspecting packaging effectiveness of an organic light-emitting diode has been proposed, in which a test strip 4 is included in an enclosed chamber 11 collectively formed by a substrate 1, a lid 2, and a sealing layer 3. The enclosed chamber 11 also receives therein a light-emitting chip 9 mounted on the substrate 1. The test strip 4 is attached to the lid 2 to oppose the light-emitting chip 9. Two ends of the test strip 4 are respectively provided with test electrodes 5. An end of the test electrode 5 is connected to the test strip 4 and another end extends to the outside of the enclosed chamber 11. The test strip 4 is generally made of a metallic material that is readily subject to oxidation, such as calcium and barium. The effectiveness of sealing of the enclosed chamber can be determined according to the variation of resistivity caused by oxidation of the test strip 4. The greater the variation of the resistivity is, the better the result of inspection will be.

This method, although effective in identifying the effectiveness of packaging of the organic light-emitting diode, is of a complicated process and a relatively high cost. Further, since the test strip is arranged opposing the light-emitting chip, certain issues, such as contamination of the light-emitting chip and conductivity of the light-emitting chip, may arise from bulging of the test strip.

SUMMARY OF THE INVENTION

Thus, an object of the present invention is to provide a method for inspecting packaging effectiveness of an OLED panel, which effectively identifies contents of moisture and oxygen existing in the package of the OLED panel so as to determine the packaging effectiveness of the OLED panel and which can be easily carried out without causing adverse effects on the panel.

To achieve the objects, the present invention provides a method for inspecting packaging effectiveness of an OLED pane, which comprises the following steps:

(1) in a manufacture process of an OLED component, forming a test block on a substrate, wherein the test block is made of an active metal, and then forming a plurality of test electrodes, wherein each of the test electrodes has an end connected to the test block and an opposite end extending to the outside for connection with a measurement device;

(2) packaging an OLED panel so that said opposite ends of the test electrodes extend out of an enclosing frame;

(3) electrically connecting the measurement device to the test electrodes to measure an actual conductivity of the test block; and (4) determining packaging effectiveness according to the actual conductivity.

The active metal is sodium, potassium, calcium, or magnesium.

The test block is formed by mean of vapor deposition.

In step (1), in the manufacture process of an OLED component, the test block is formed before an organic layer is formed on an anode and after a cathode is formed on the organic layer.

In step (1), in the manufacture process of an OLED component, the test electrodes are formed at the same time when a cathode is formed on an organic layer.

The test electrodes are formed by means of vapor deposition.

The test electrodes are of a number of four and in step (3), a four-probe resistivity detection process is applied to measure the actual conductivity of the test block.

Step (4) comprises providing a chart showing relationship between water/oxygen content and conductivity of the test block and identifying, in the chart showing relationship between water/oxygen content and conductivity of the test block, a value of water/oxygen content corresponding to the actual conductivity, and determining the packaging effectiveness according to the value of water/oxygen content.

The chart showing relationship between water/oxygen content and conductivity of the test block comprises at least conductivities of the test block corresponding to water/oxygen content of 100 ppm, 500 ppm, 1000 ppm, 10000 ppm, and $10^6$ ppm.

The substrate comprises a glass substrate.

The present invention also provides a method for inspecting packaging effectiveness of an OLED panel, which comprises the following steps:

(1) in a manufacture process of an OLED component, forming a test block on a substrate, wherein the test block is made of an active metal, and then forming a plurality of test electrodes, wherein each of the test electrodes has an end connected to the test block and an opposite end extending to the outside for connection with a measurement device;

(2) packaging an OLED panel so that said opposite ends of the test electrodes extend out of an enclosing frame;

(3) electrically connecting the measurement device to the test electrodes to measure an actual conductivity of the test block; and (4) determining packaging effectiveness according to the actual conductivity; and wherein the active metal is sodium, potassium, calcium, or magnesium;

wherein the test block is formed by mean of vapor deposition;

wherein in step (1), in the manufacture process of an OLED component, the test block is formed before an organic layer is formed on an anode and after a cathode is formed on the organic layer;

wherein in step (1), in the manufacture process of an OLED component, the test electrodes are formed at the same time when a cathode is formed on an organic layer;

wherein the test electrodes are formed by means of vapor deposition;

wherein the test electrodes are of a number of four and in step (3), a four-probe resistivity detection process is applied to measure the actual conductivity of the test block;

wherein step (4) comprises providing a chart showing relationship between water/oxygen content and conductivity of the test block and identifying, in the chart showing relationship between water/oxygen content and conductivity of the test block, a value of water/oxygen content corresponding to the actual conductivity, and determining the packaging effectiveness according to the value of water/oxygen content;

wherein the chart showing relationship between water/oxygen content and conductivity of the test block comprises at least conductivities of the test block corresponding to water/oxygen content of 100 ppm, 500 ppm, 1000 ppm, 10000 ppm, and $10^6$ ppm; and wherein the substrate comprises a glass substrate.

The efficacy of the present invention is that the present invention provides a method for inspecting packaging effectiveness of an OLED panel, which makes use of conductivity differential of a test block made of an active metal in environments having different water/oxygen content to detect, in a more precise manner, the water/oxygen content in a packaged OLED panel so as to correctly determine the effectiveness of packaging. The method for inspecting the OLED has a simple process and can be easily performed and further, test electrodes can be formed on the test block at the same time of the formation of a cathode so as to effectively reduce the manufacture cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

An OLED panel, after being packaged, requires to be subjected to inspection of a sealed space contained therein in order to ensure the lifetime of the OLED panel. Currently, the lifetime of an OLED must exceed or equal 10,000 hours so that the desired packaging effectiveness where the water permeability of the packaged OLED panel is less than or equal to $10^{-6}$ g/m$^2$/day and oxygen permeability is less than or equal to $10^{-5}$ cc/m$^2$/day (1 atm) can be achieved. Estimation made based on these requirements can determine that the water content in the enclosed space of the packaged OLED panel should not exceed 1,000 ppm and the oxygen content should not exceed $10^6$ ppm. Therefore, the water/oxygen content in the enclosed space of the packaged OLED panel can be used as an inspection standard to determine if the OLED is qualified. The present invention provides a method for inspecting packaging effectiveness of an OLED panel by determining the water/oxygen content in an enclosed space formed in the packaged OLED panel.

Figure 1:
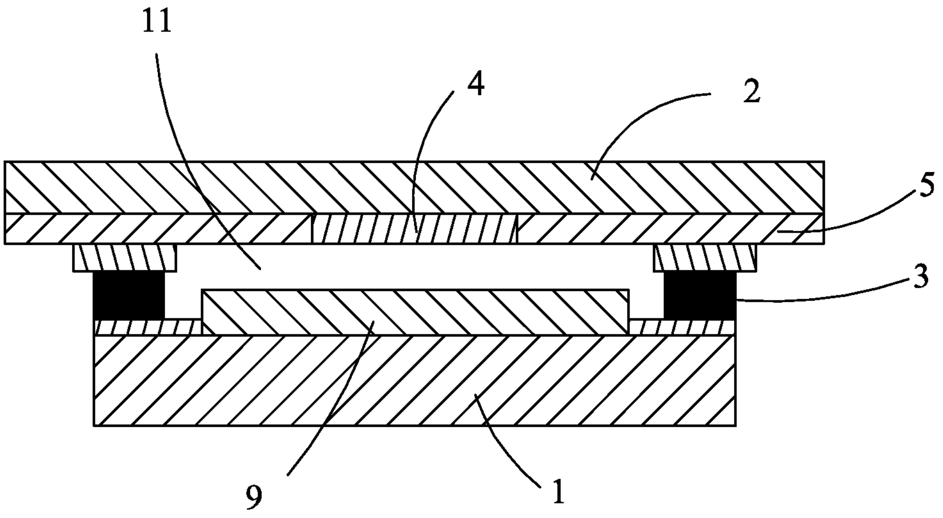
Fig. 1 (Prior Art)
FIG. 1 is a cross-sectional view showing a conventional organic light-emitting diode.
Figure 2:
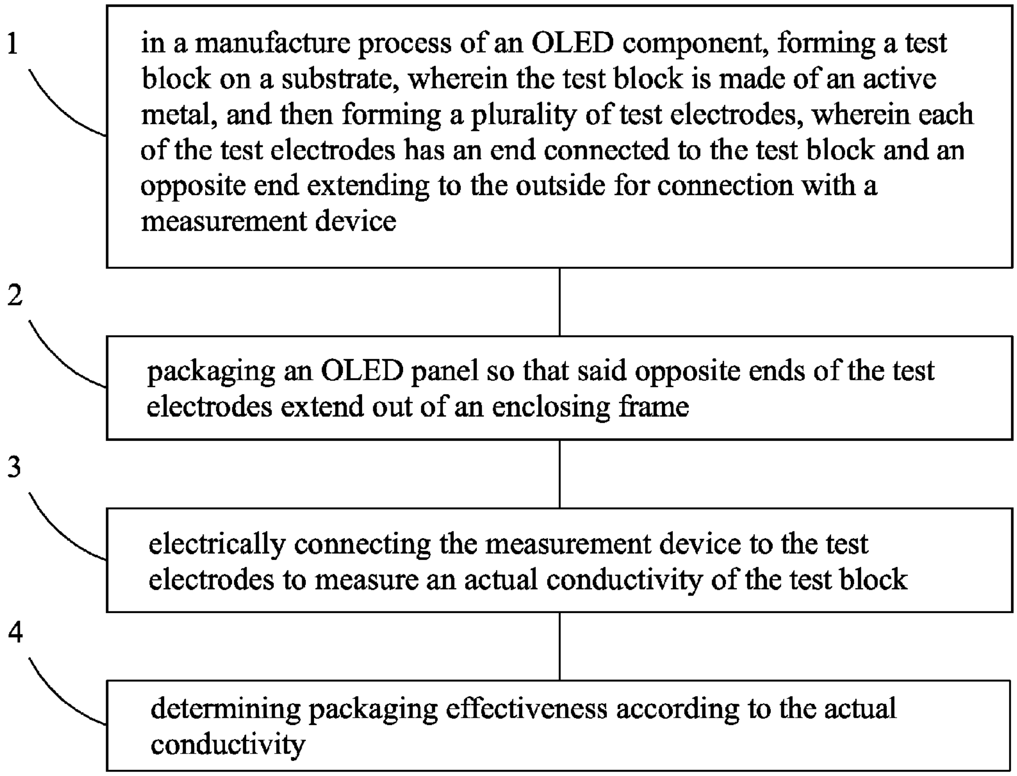
FIG. 2 is a flow chart illustrating a method for inspecting packaging effectiveness of an OLED panel according to the present invention.
Figure 3:
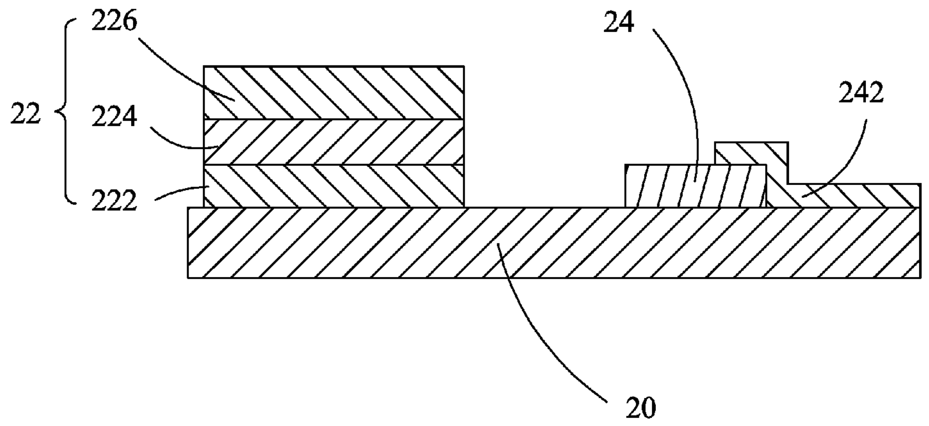
FIG. 3 is a cross-sectional view showing a structure formed of a test block and test electrodes according to the present invention.

Referring to FIGS. 2 and 3, the present invention provides a method for inspecting packaging effectiveness of an OLED panel, which comprises the following steps:

Step 1: in a manufacture process of an OLED component, forming a test block 24 on a substrate 20, wherein the test block 24 is made of an active metal, and then forming a plurality of test electrodes 242, wherein each of the test electrodes 242 has an end connected to the test block 24 and an opposite end extending to the outside for connection with a measurement device (not shown).

Figure 4:
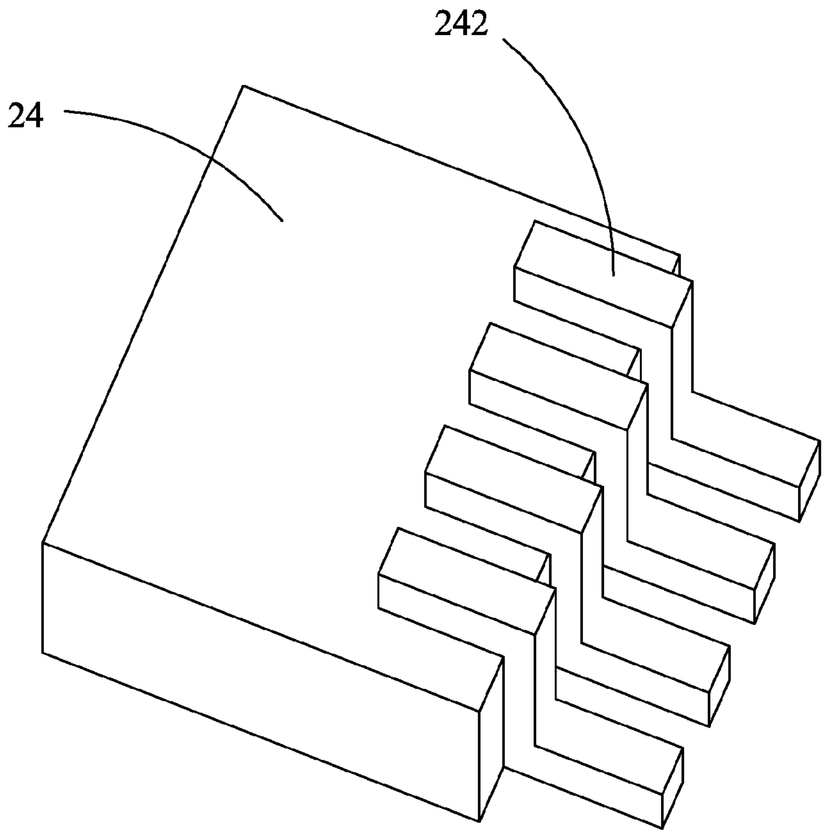
FIG. 4 is a perspective view showing the test block and test electrodes according to the present invention.

Referring to FIGS. 3 and 4, the substrate 20 is a transparent substrate, preferably a glass substrate. The manufacture process of the OLED component 22 generally comprises: first forming an anode 222 on the substrate 20; then forming an organic layer 224 formed on the anode 222; and finally forming a cathode 226 on the organic layer 224. In the instant embodiment, the test block 24 is formed after the formation of the organic layer 224 but before the formation of the cathode 226 and the test electrodes 242 are formed simultaneously with the cathode 226, so that one step can be saved and the manufacture cost can be reduced.

Specifically, the test block 24 is made of an active metal, such as sodium, potassium, calcium, and magnesium, which can readily react with water and oxygen, through vapor deposition. The test electrodes 242 and the cathode 226 are simultaneously formed of the same metal through vapor deposition.

It is noted that the organic layer 224 generally includes a hole transport layer (HTL) formed on the anode 222, an emitting material layer (EML) formed on the hole transport layer, and an electron transport layer (ETL) formed on the emitting material layer, each of these layer being formed through vapor deposition.

Step 2: packaging an OLED panel so that said opposite ends of the test electrodes 242 extend out of an enclosing frame 60.

Figure 5:
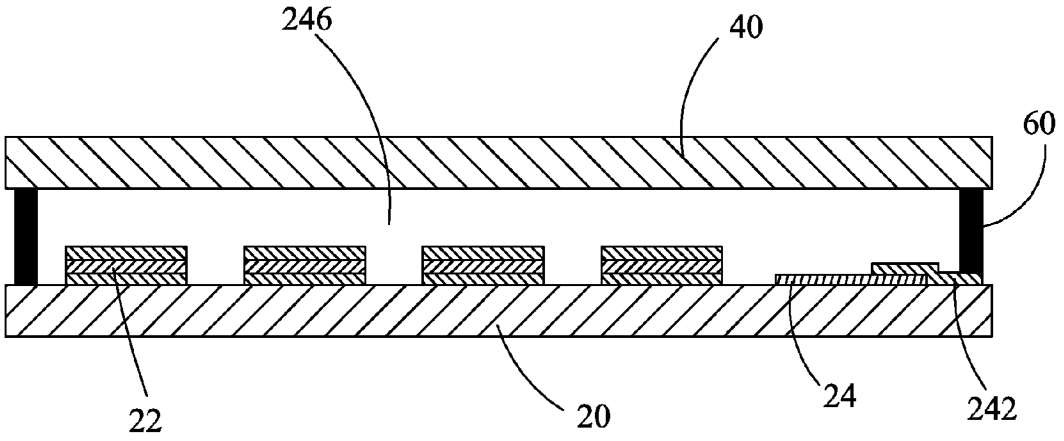
FIG. 5 is a cross-sectional view showing the structure of an OED panel after being packaged according to the present invention.

Specifically, referring to FIG. 5, a sealing resin is applied to a circumferential margin of the substrate 20. A lid 40 is set on and attached to the substrate 20. The sealing resin is cured to form the enclosing frame 60. The substrate 20, the lid 40, and the enclosing frame 60 collectively form an enclosed space 246. The OLED component 22 and the test block 24 are both enclosed in the enclosed space 246 and one end of each of the test electrodes 242 is electrically connected to the test block 24 and an opposite end extending out of the enclosing frame 60 to electrically connect to an external measurement device.

Step 3: electrically connecting the measurement device to the test electrodes 242 to measure an actual conductivity of the test block 24.

Figure 6:
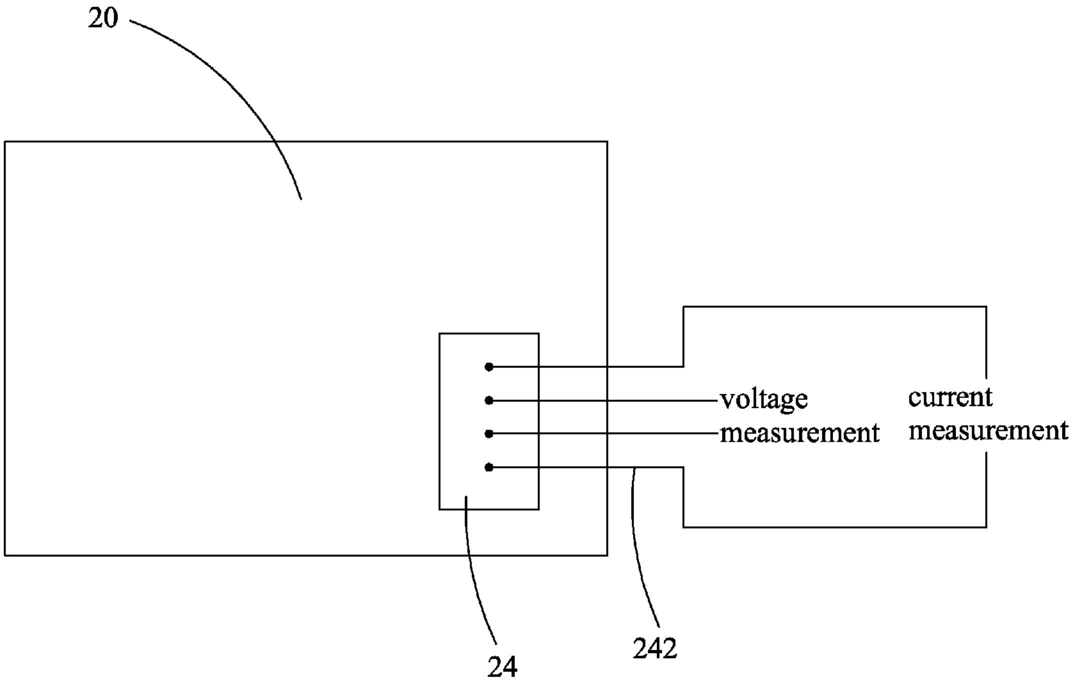
FIG. 6 is schematic view illustrating measurement of actual conductivity of the test block according to the present invention.

Referring to FIGS. 4 and 6, in the instant embodiment, the test electrodes 242 are of a number of four and am four-probe resistivity detection process is applied to measure the actual conductivity of the test block. Specifically, two of the test electrodes 242 are employed to measure the actual voltage of the test block 24, while the other two of the test electrodes 242 are used to measure the actual current flowing through the test block 24, whereby through the simultaneous conduction of the measurement operations, the result of measurement can be made more precise and the actual conductivity of the test block 24 can be determined through calculation made on the measured actual voltage and current.

Step 4: determining packaging effectiveness according to the actual conductivity.

Specifically, a chart of the relationship between water/oxygen content and the conductivity of the test block is provided and the value of water/oxygen content corresponding to the actual conductivity is looked up with the chart of the relationship between the water/oxygen content and the conductivity of the test block. The packaging effectiveness can be determined according to the value of water/oxygen content. The chart of the relationship between the water/oxygen content and conductivity of the test block includes the conductivities of the test block corresponding to water/oxygen contents of 100 ppm, 500 ppm, 1000 ppm, 10000 ppm, and $10^6$ ppm.

Figure 7:
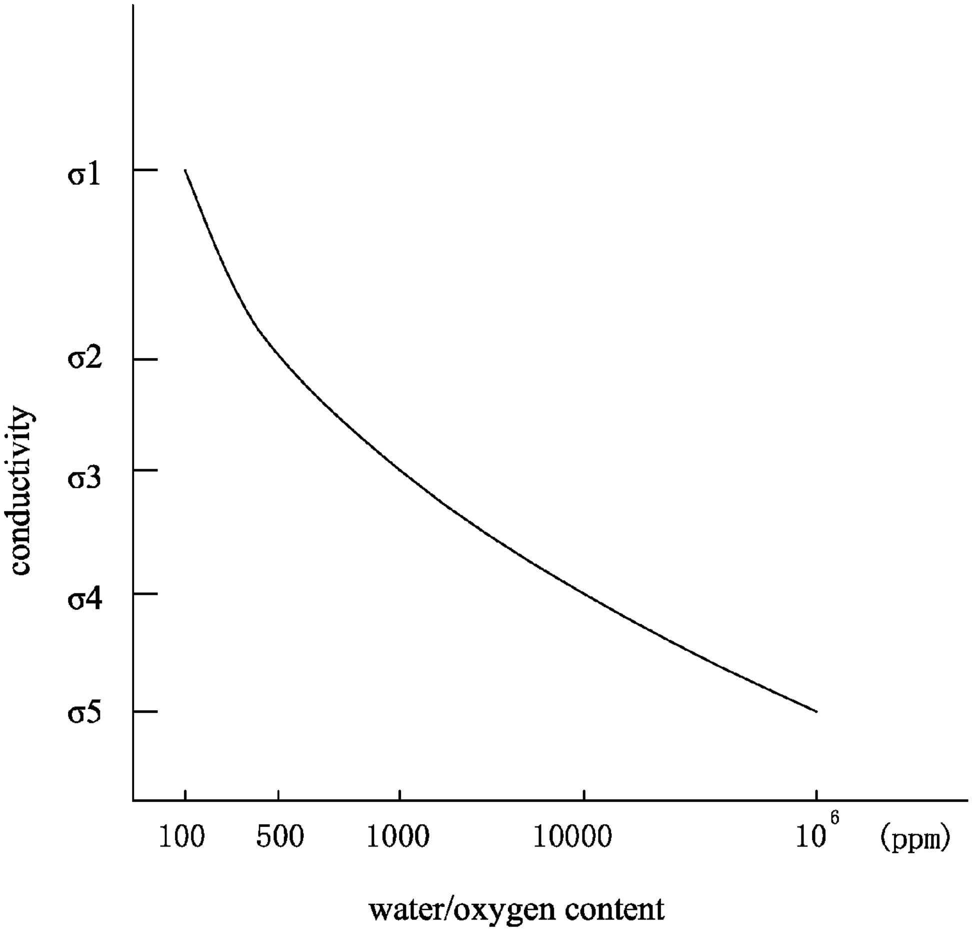
FIG. 7 is a graph illustrating the relationship between water/oxygen content and the conductivity of a sodium based test block according to an embodiment of the method for inspecting packaging effectiveness of an OLED panel of the present invention.

An example that the test block is made of sodium will be described:

A chart showing the relationship between water/oxygen content and conductive of the sodium made test block is first prepared, where the sodium made test block is placed in environments having different water/oxygen contents and the conductivities thereof and the conductivities are measured for the corresponding environments so that the chart of the relationship between the water/oxygen contents and the conductivities of the sodium made test block can be plotted according to the results of the measurements. For example, for water/oxygen contents of 100 ppm, 500 ppm, 1000 ppm, 10000 ppm, and $10^6$ ppm and the corresponding conductivities of the sodium made test block being respectively $\sigma 1$, $\sigma 2$, $\sigma 3$, $\sigma 4$, and $\sigma 5$, a graph showing the relationship between the water/oxygen content and the sodium made test block can be plotted with the conductivities plotted on the abscissa and the water/oxygen contents on the ordinate (FIG. 7).

Then, step 3 is carried out to obtain the actual conductivity $\sigma$, and the water/oxygen content corresponding to the actual conductivity $\sigma$ can be found by looking up the chart of the relationship between water/oxygen content and conductivity of the sodium made test block. If the value of $\sigma$ is located between $\sigma 3$ and $\sigma 4$, then the water/oxygen content inside the enclosed space of the packaged OLED is between 500 ppm and 1000 ppm. Thus, according to the packaging standards that the water content in the enclosed space of a packaged OLED panel should not exceed 1000 ppm and the oxygen content should not exceed $10^6$ ppm, it is determined that the packaging of the OLED panel is qualified.

In summary, the present invention provides a method for inspecting packaging effectiveness of an OLED panel, which makes use of conductivity differential of a test block made of an active metal in environments having different water/oxygen content to detect, in a more precise manner, the water/oxygen content in a packaged OLED panel so as to correctly determine the effectiveness of packaging. The method for inspecting the OLED has a simple process and can be easily performed and further, test electrodes can be formed on the test block at the same time of the formation of a cathode so as to effectively reduce the manufacture cost and the test block causes no adverse effect on the manufacture of the OLED panel.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for inspecting packaging effectiveness of an OLED panel, comprising the following steps:

(1) in a manufacture process of an OLED component, forming a test block on a substrate, wherein the test block is made of an active metal, and then forming a plurality of test electrodes, wherein each of the test electrodes has an end connected to and overlying the test block and an opposite end extending to the outside for connection with a measurement device;

(2) packaging an OLED panel, wherein the packaged OLED comprises an enclosed space formed by the substrate, a lid and an enclosing frame arranged between the substrate and the lid, the OLED component having an anode, an organic layer and a cathode arranged in that order is disposed in the enclosed space, the test block is disposed in the enclosed space and spaced from the anode, the organic layer and the cathode, and the opposite ends of the plurality of test electrodes extend out of the enclosed space;

(3) electrically connecting the measurement device to the test electrodes to measure an actual conductivity of the test block; and (4) determining packaging effectiveness according to the actual conductivity.

2. The method for inspecting packaging effectiveness of an OLED panel as claimed in claim 1, wherein the active metal is sodium, potassium, calcium, or magnesium.

3. The method for inspecting packaging effectiveness of an OLED panel as claimed in claim 1, wherein the test block is formed by mean of vapor deposition.

4. The method for inspecting packaging effectiveness of an OLED panel as claimed in claim 1, wherein in step (1), in the manufacture process of an OLED component, the test block is formed after the organic layer being formed on the anode and before the cathode being formed on the organic layer.

5. The method for inspecting packaging effectiveness of an OLED panel as claimed in claim 1, wherein in step (1), in the manufacture process of an OLED component, the test electrodes are formed at the same time when the cathode is formed on the organic layer.

6. The method for inspecting packaging effectiveness of an OLED panel as claimed in claim 1, wherein the test electrodes are formed by means of vapor deposition.

7. The method for inspecting packaging effectiveness of an OLED panel as claimed in claim 1, wherein the test electrodes are of a number of four and in step (3), a four-probe resistivity detection process is applied to measure the actual conductivity of the test block.

8. The method for inspecting packaging effectiveness of an OLED panel as claimed in claim 1, wherein the substrate comprises a glass substrate.

9. The method for inspecting packaging effectiveness of an OLED panel as claimed in claim 1, wherein the test block is consisted of the active metal.

10. The method for inspecting packaging effectiveness of an OLED panel as claimed in claim 1, wherein step (4) comprises providing a chart showing relationship between water/oxygen content and conductivity of the test block and identifying, in the chart showing relationship between water/oxygen content and conductivity of the test block, a value of water/oxygen content corresponding to the actual conductivity, and determining the packaging effectiveness according to the value of water/oxygen content.

11. The method for inspecting packaging effectiveness of an OLED panel as claimed in claim 10, wherein the chart showing relationship between water/oxygen content and conductivity of the test block comprises at least conductivities of the test block corresponding to water/oxygen content of 100 ppm, 500 ppm, 1000 ppm, 10000 ppm, and $10^6$ ppm.

12. A method for inspecting packaging effectiveness of an OLED panel, comprising the following steps:

(1) in a manufacture process of an OLED component, forming a test block on a substrate, wherein the test block is consisted of an active metal, and then forming a plurality of test electrodes, wherein each of the test electrodes has an end connected to the test block and an opposite end extending to the outside for connection with a measurement device;

(2) packaging an OLED panel so that said opposite ends of the test electrodes extend out of an enclosing frame;

(3) electrically connecting the measurement device to the test electrodes to measure an actual conductivity of the test block; and (4) determining packaging effectiveness according to the actual conductivity; and wherein the active metal is sodium, potassium, calcium, or magnesium;

wherein the test block is formed by mean of vapor deposition;

wherein in step (1), in the manufacture process of an OLED component, the test block is formed after an organic layer of the OLED component being formed on an anode of the OLED component and before a cathode of the OLED component being formed on the organic layer;

wherein in step (1), in the manufacture process of an OLED component, the test electrodes are formed at the same time when the cathode is formed on the organic layer;

wherein the test electrodes are formed by means of vapor deposition;

wherein the test electrodes are of a number of four and in step (3), a four-probe resistivity detection process is applied to measure the actual conductivity of the test block;

wherein step (4) comprises providing a chart showing relationship between water/oxygen content and conductivity of the test block and identifying, in the chart showing relationship between water/oxygen content and conductivity of the test block, a value of water/oxygen content corresponding to the actual conductivity, and determining the packaging effectiveness according to the value of water/oxygen content;

wherein the chart showing relationship between water/oxygen content and conductivity of the test block comprises at least conductivities of the test block corresponding to water/oxygen content of 100 ppm, 500 ppm, 1000 ppm, 10000 ppm, and $10^6$ ppm; and wherein the substrate comprises a glass substrate.

13. The method for inspecting packaging effectiveness of an OLED panel as claimed in claim 12, wherein the packaged OLED comprises an enclosed space formed by the substrate, a lid and an enclosing frame arranged between the substrate and the lid, the OLED component having the anode, the organic layer and the cathode arranged in that order is disposed in the enclosed space, the test block is disposed in the enclosed space and spaced from the anode, the organic layer and the cathode, and the opposite ends of the plurality of test electrodes extend out of the enclosed space.

* * * * *